(12) United States Patent
Fukunaga et al.

(10) Patent No.: US 8,797,763 B2
(45) Date of Patent: Aug. 5, 2014

(54) SHIELD STRUCTURE FOR AN ELECTRONIC ELEMENT AND ELECTRONIC DEVICE

(75) Inventors: Naomi Fukunaga, Kawasaki (JP); Hisashi Yoshinaga, Kawasaki (JP); Junichi Ogou, Kawasaki (JP); Naofumi Kosugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 170 days.

(21) Appl. No.: 13/005,718

(22) Filed: Jan. 13, 2011

(65) Prior Publication Data

US 2011/0188227 A1 Aug. 4, 2011

(30) Foreign Application Priority Data

Jan. 29, 2010 (JP) ................................. 2010-019361

(51) Int. Cl.
*H05K 7/14* (2006.01)
*H05K 7/18* (2006.01)

(52) U.S. Cl.
USPC .......................................... 361/799; 361/816

(58) Field of Classification Search
USPC .......... 361/799, 800, 816, 818; 174/51, 35 R; 439/130, 608, 609
See application file for complete search history.

(56) References Cited

U.S. PATENT DOCUMENTS

| | | | |
|---|---|---|---|
| 5,696,669 A | 12/1997 | Bassler et al. | |
| 5,708,552 A | 1/1998 | Han et al. | |
| 5,717,577 A * | 2/1998 | Mendolia et al. | 361/818 |
| 5,763,900 A * | 6/1998 | Wang | 257/81 |
| 6,049,469 A * | 4/2000 | Hood et al. | 361/818 |
| 6,320,122 B1 * | 11/2001 | Dickey et al. | 174/359 |
| 6,442,028 B2 * | 8/2002 | Yamazaki | 361/704 |
| 6,443,768 B1 * | 9/2002 | Dirkers et al. | 439/607.2 |
| 6,744,640 B2 * | 6/2004 | Reis et al. | 361/818 |
| 6,943,287 B2 * | 9/2005 | Lloyd et al. | 174/359 |
| 7,135,643 B2 * | 11/2006 | van Haaster et al. | 174/382 |
| 7,259,969 B2 * | 8/2007 | Zarganis et al. | 361/800 |
| 7,463,495 B2 * | 12/2008 | Tanaka et al. | 361/807 |
| 7,626,832 B2 * | 12/2009 | Muramatsu et al. | 361/818 |
| 8,149,594 B2 * | 4/2012 | Nishihata | 361/818 |
| 8,183,470 B2 * | 5/2012 | Zhang et al. | 174/359 |
| 2003/0008562 A1 | 1/2003 | Yamasaki | |
| 2003/0161108 A1 | 8/2003 | Bright et al. | |
| 2007/0293065 A1 | 12/2007 | Sato | |

FOREIGN PATENT DOCUMENTS

| | | |
|---|---|---|
| EP | 1 871 157 | 12/2007 |
| JP | 3-97997 | 10/1991 |
| JP | 5-2482 | 1/1993 |
| JP | 06-283234 | 10/1994 |
| JP | 7-96009 | 10/1995 |
| JP | 9-198482 | 7/1997 |
| JP | 09-237987 | 9/1997 |
| JP | 2000-340305 | 12/2000 |

(Continued)

OTHER PUBLICATIONS

European Search Report dated Sep. 2, 2011 for corresponding European Patent Application No. 11152031.8.

(Continued)

*Primary Examiner* — Hung S Bui
(74) *Attorney, Agent, or Firm* — Staas & Halsey LLP

(57) ABSTRACT

A shield structure for an electronic element, includes a ground pattern provided in a board; and a first member having electrical conductivity, covering the electronic element, and connected with the ground pattern.

7 Claims, 30 Drawing Sheets

(56) References Cited

FOREIGN PATENT DOCUMENTS

| | | |
|---|---|---|
| JP | 2003-017193 | 1/2003 |
| JP | 3516407 | 1/2004 |
| JP | 2006/090471 | 8/2006 |
| KR | 2003-0057535 | 7/2003 |
| WO | WO 01/28305 | 4/2001 |
| WO | 02/30170 A1 | 4/2002 |

OTHER PUBLICATIONS

Korean Office Action mailed Jan. 16, 2012 issued in corresponding Korean Patent Application No. 10-2011-0008347.
Japanese Office Action issued Sep. 24, 2013 in corresponding Japanese Patent Application No. 2010-019361.
Japanese Office Action mailed Apr. 22, 2014 in corresponding Japanese Application No. 2010-019361.

* cited by examiner

FIG. 7A
FIG. 7B
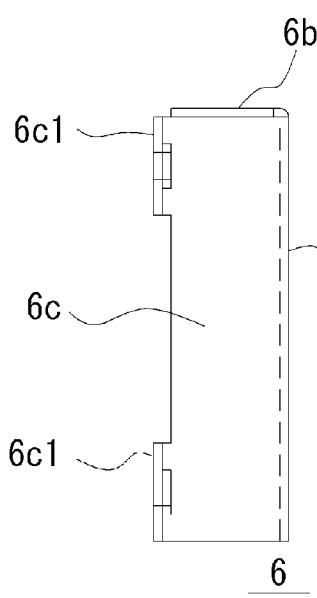
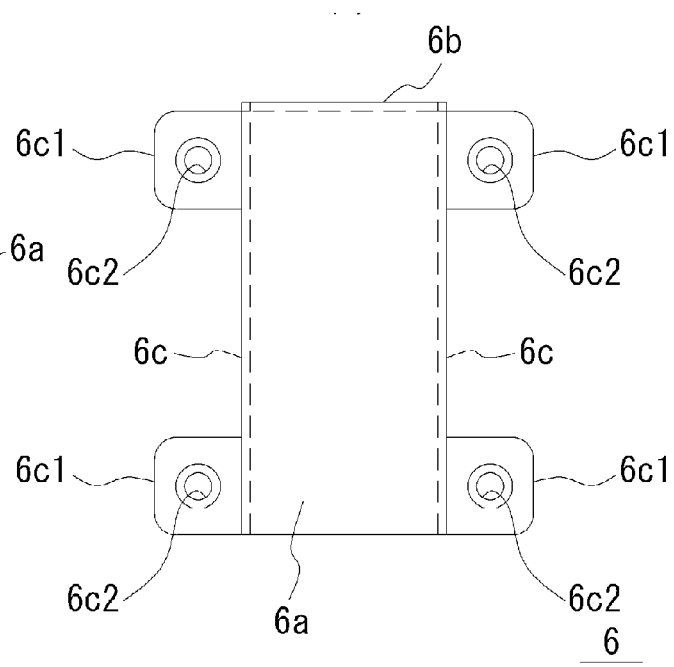
FIG. 7C
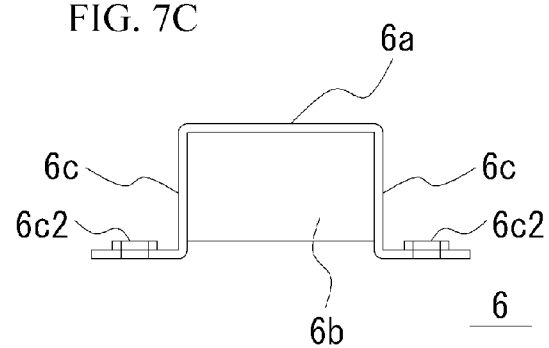

FIG. 13A
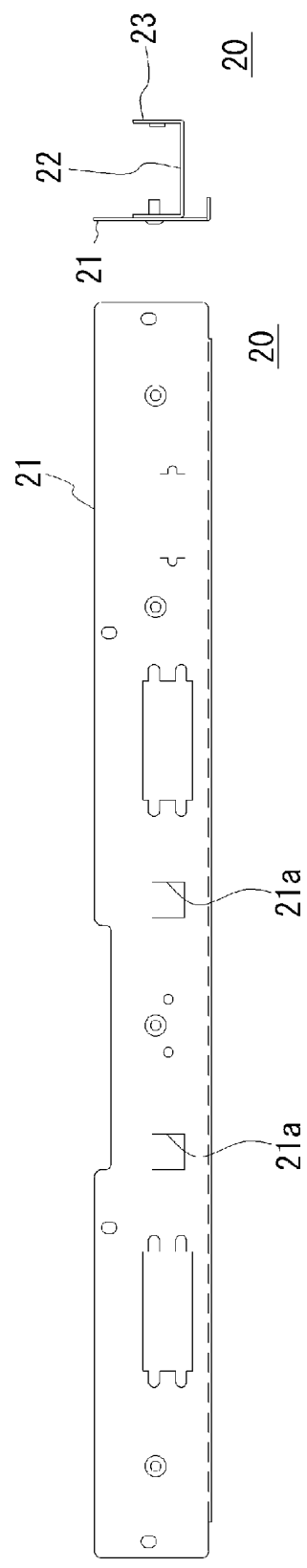
FIG. 13B
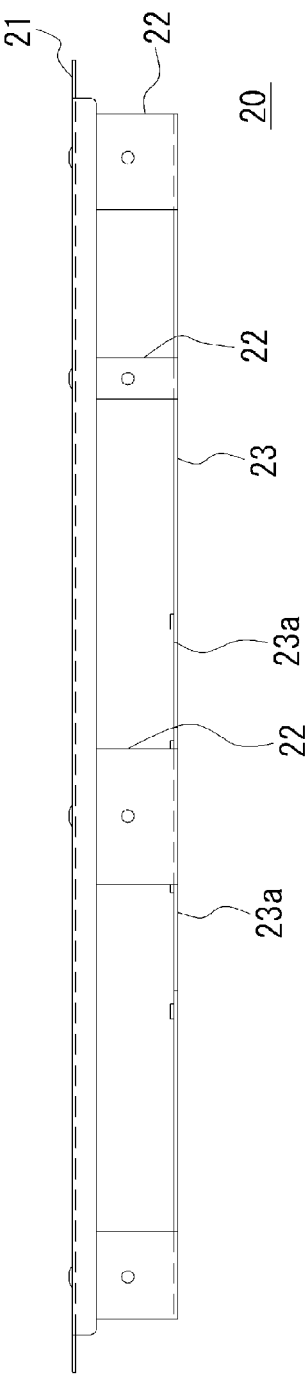
FIG. 13C

FIG. 26A
FIG. 26B
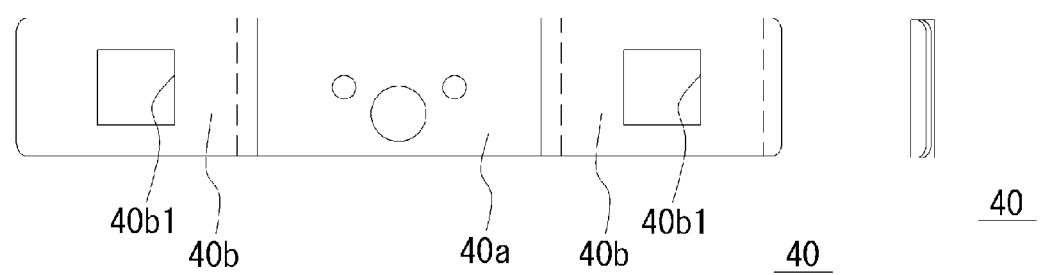
FIG. 26C
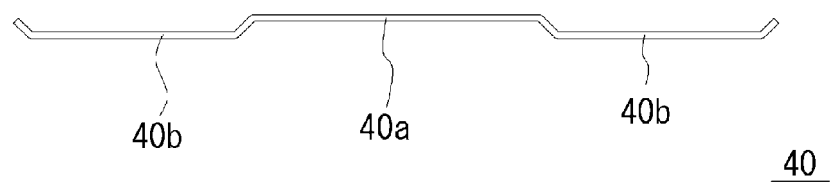

SHIELD STRUCTURE FOR AN ELECTRONIC ELEMENT AND ELECTRONIC DEVICE

CROSS-REFERENCE TO RELATED APPLICATION

This application is based upon and claims the benefit of priority of the prior Japanese Patent Application No. 2010-019361, filed on Jan. 29, 2010, the entire contents of which are incorporated herein by reference.

FIELD

Embodiments discussed herein are related to a shield structure and an electronic device.

BACKGROUND

It is important to suppress noise in an electronic device. There are conventionally proposed various noise suppressions are proposed in an electronic device. For example, there is proposed a shield member separately shielding a patient circuit portion and a signal input and output portion in Japanese Examined Patent Application Publication No. 7-96009. Also, in a data transmission device equipped with first and second boards, there is proposed a shield member covering first and second boards and shielding an electrical noise in Japanese Patent No. 3516407.

In a case where an electronic device employs an electronic element, particularly, one having sensitivity of noise, static electricity generated in an outside of the electronic device might malfunction an electronic circuit or an electronic element in the electronic device. For example, in a photoelectric conversion element that includes a photoelectric conversion portion converting optical signals into electrical signals, the photoelectric conversion element is affected by noise and has low electrostatic discharge (ESD) resistance.

In light of these problems, the proposals of the above mentioned patent documents shield the entire board or a special area. The improvement in the ESD resistance of the electronic element is insufficient.

SUMMARY

According to an aspect of the embodiments, a shield structure for an electronic element, including: a ground pattern provided in a board; and a first member having electrical conductivity, covering the electronic element, and connected with the ground pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 7A to 7C are three views of a first hardware, FIG. 7A is a plan view, FIG. 7B is a side view, and FIG. 7C is a back view;

FIGS. 13A to 13C are three views of a hardware included in the second hardware, FIG. 13A is a back view, FIG. 13B is a side view, and FIG. 13C is a bottom view;

FIG. 14A is a plan view, FIG. 14B is a back view, and FIG. 14C is a side view;

FIG. 20A is a back view, FIG. 20B is a side view, and FIG. 20C is a bottom view;

FIG. 21A is a back view, FIG. 21B is a side view, and FIG. 21C is a bottom view;

FIGS. 26A to 26C are three views of the fourth hardware, FIG. 26A is a back view, FIG. 26B is a side view, and FIG. 26C is a bottom view;

DESCRIPTION OF EMBODIMENTS

In the following, embodiments will be described with reference to the accompanying drawings. However, dimensions and ratios of components may be identified to those of real components. Further, details may be omitted in drawings.

(First Embodiment)

Figure 1:
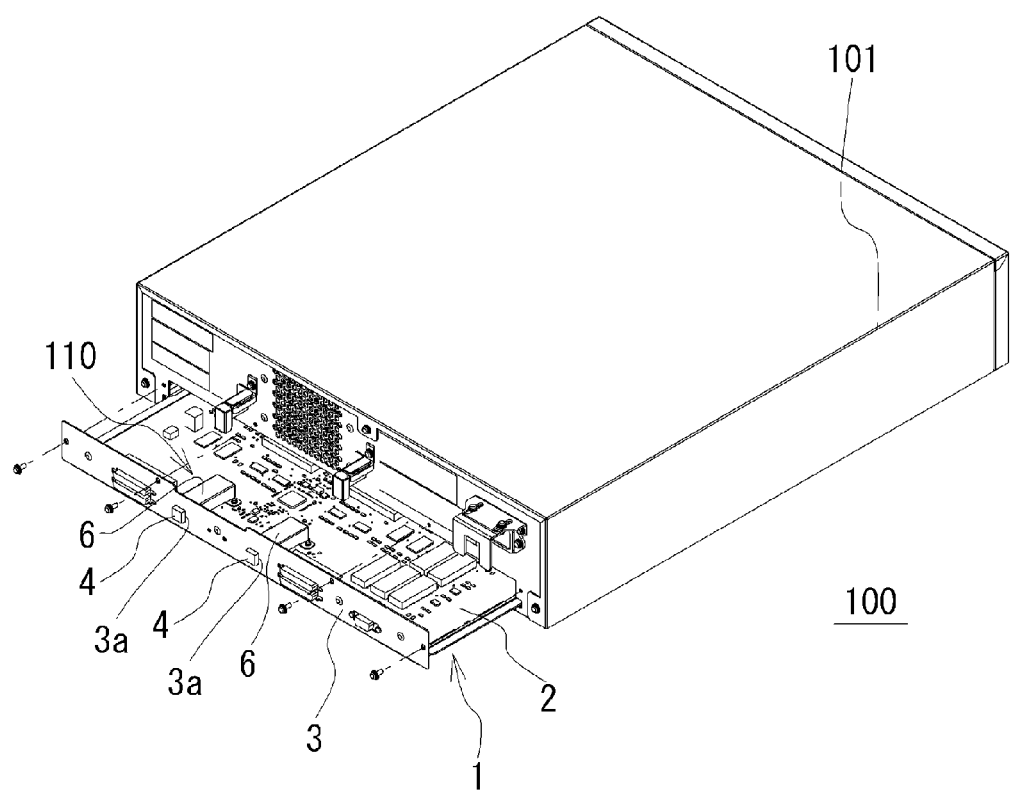
FIG. 1 is a perspective view of an electronic device with a shield structure according to a first embodiment.
Figure 2:
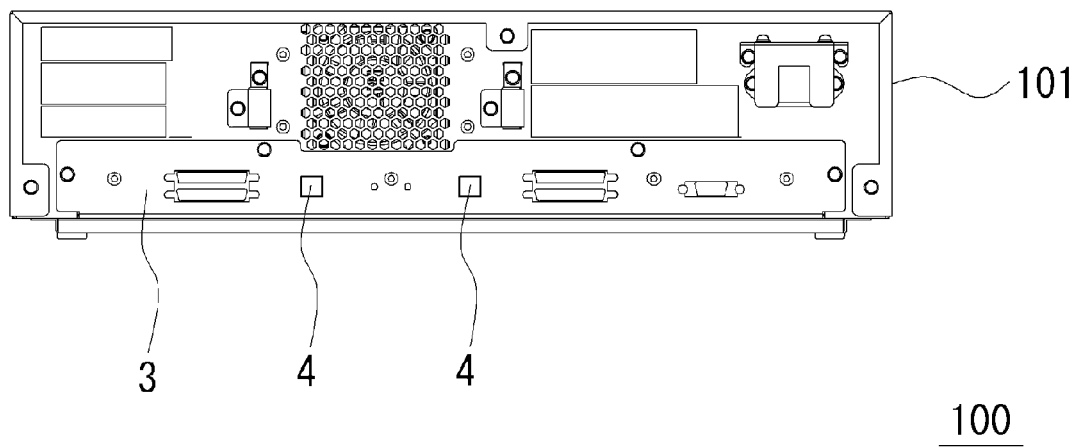
FIG. 2 is a back view of the electronic device with the shield structure according to the first embodiment.
Figure 3:
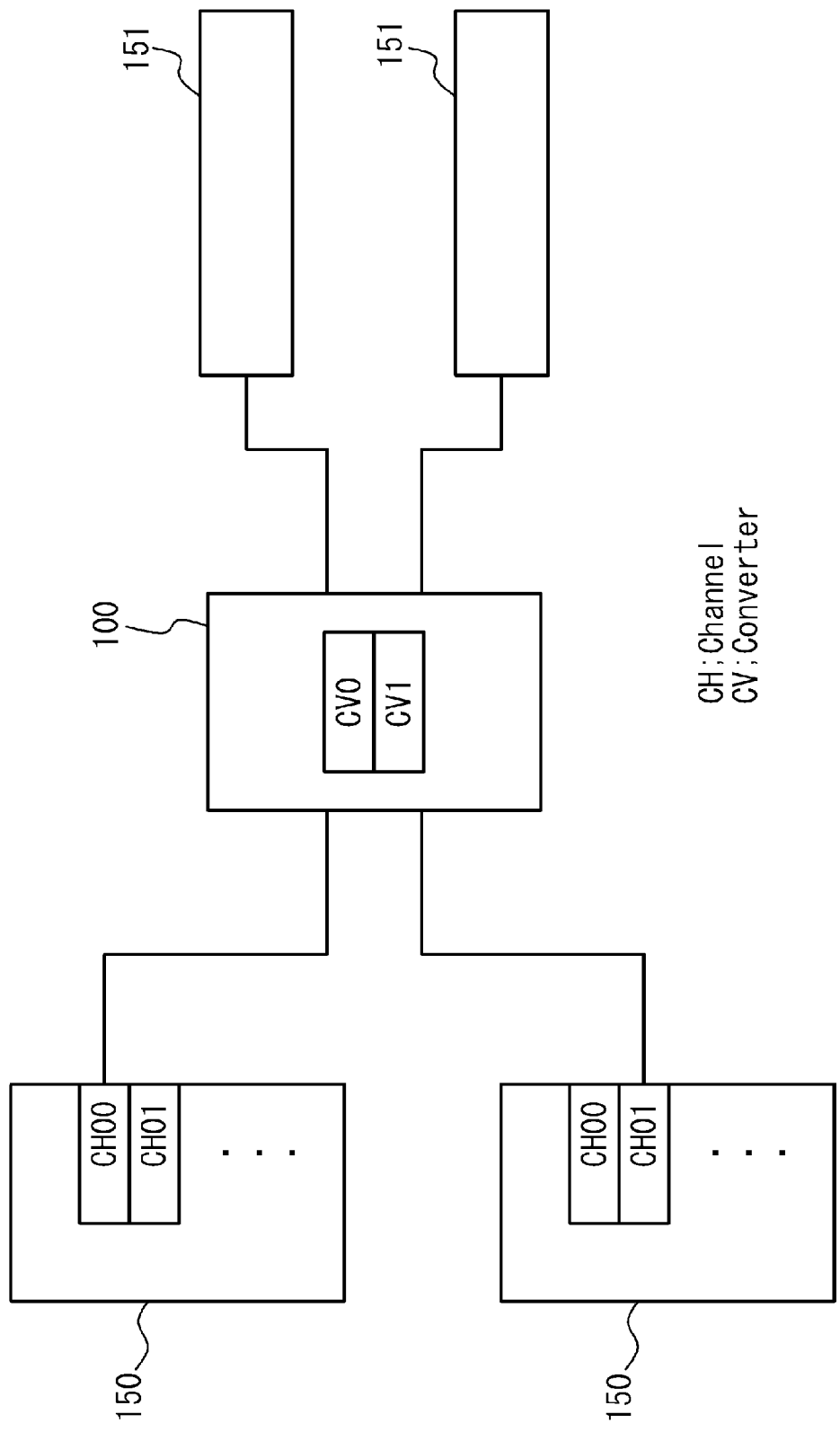
FIG. 3 is an explanatory view of an example of use of the electronic device according to the first embodiment.

FIG. 1 is a perspective view of an electronic device 100 with a shield structure 110 according to a first embodiment. FIG. 2 is a back view of the electronic device 100 with the shield structure 110 according to the first embodiment. FIG. 3 is an explanatory view of an example of use of the electronic device 100. The electronic device 100 is arranged between servers 150 and electronic interfaces 151 of devices such as printers or display control devices. The electronic device 100 converts optical signals and electrical signals and vice versa. In FIG. 3, an intermediate device corresponds to the electronic device 100. In the example as illustrated in FIG. 3, CH00 (CHANNEL 00) of the server 150 is connected to the CV0 (CONVERTER 0) of the electronic device 100 through an optical fiver, so the optical signals are transmitted and received therebeween. Further, each of CV0 and CV1 is connected to the interface 151 through a cable transmits and receives electrical signals.

The electronic device 100 is provided with a board unit 1 within a chassis 101. The board unit 1 includes a printed board 2 which is an example of a board. The board unit 1 is provided with a back plate 3. The board unit 1 is inserted into the chassis 101 from the back side thereof. The back plate 3 is secured on the chassis 101 with screws. Also, the back plate 3 has an effect of suppressing electro magnetic interference (EMI).

The printed board 2 is provided with an electronic circuit. The electronic elements 4 are arranged at a rear end portion of the printed board 2. The electronic element 4 is a photoelectric conversion element which is connectable with the optical fiver cable. The electronic element 4 includes a connecting portion which is connectable with the optical fiver cable and which is exposed through an opening 3a. A printed board is provided within the electronic element 4 and is provided with a photoelectric conversion circuit which converts optical signals into electrical signals. A signal ground SG of the printed board is connected to an outer cover of the electronic element 4. In this way, the electronic element 4 includes the photoelectric conversion portion. The shield structure 110 is provided for improving the ESD resistance of the electronic element 4.

Figure 4:
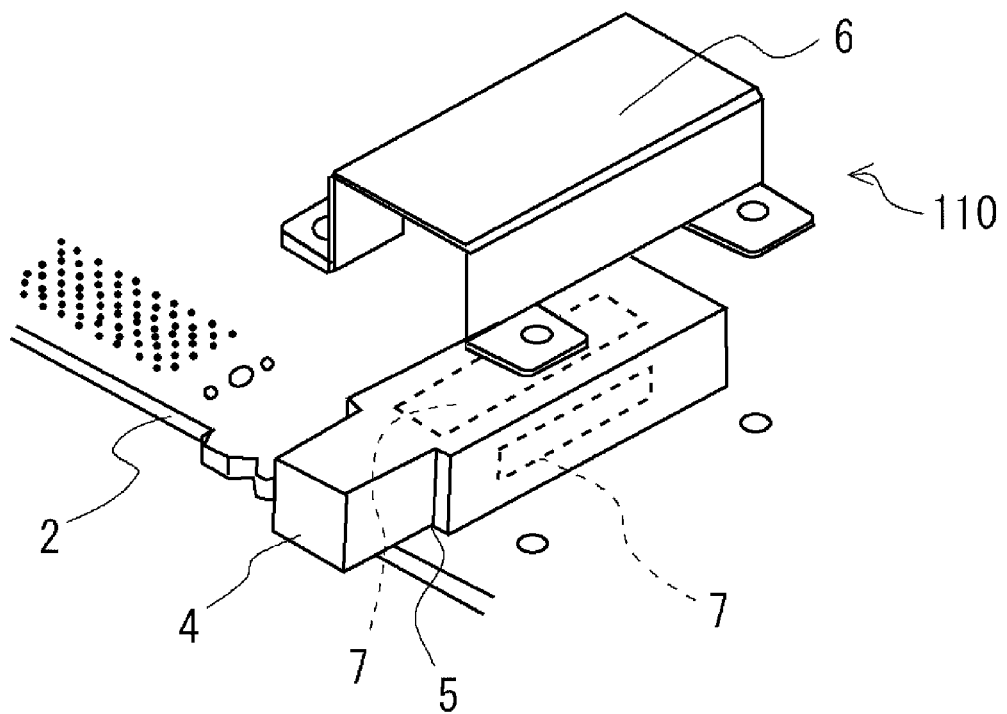
FIG. 4 is a perspective view of the periphery of an electronic element with a first hardware being removed according to the first embodiment.
Figure 5:
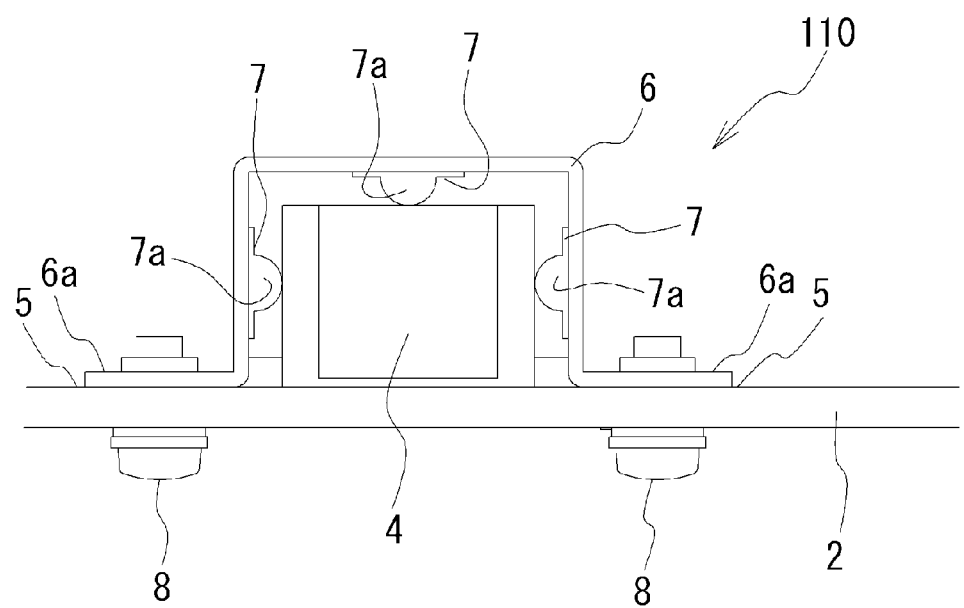
FIG. 5 is a back view of the periphery of the electronic element according to the first embodiment.

FIG. 4 is a perspective view of the periphery of the electronic element 4. FIG. 5 is a back view of the periphery of the electronic element 4 mounted on the printed board 2.

The shield structure 110 includes a ground pattern 5 formed on the printed board 2, as illustrated in FIG. 4. The electronic element 4 is mounted on the ground pattern 5. The shield structure 110 includes a first hardware 6 corresponding to a first member with electrical conductivity. As illustrated in FIGS. 4 and 5, the first hardware 6 covers the electronic element 4 and is connected with the ground pattern 5. Additionally, the first hardware 6 is detached in FIG. 4.

Figure 6:
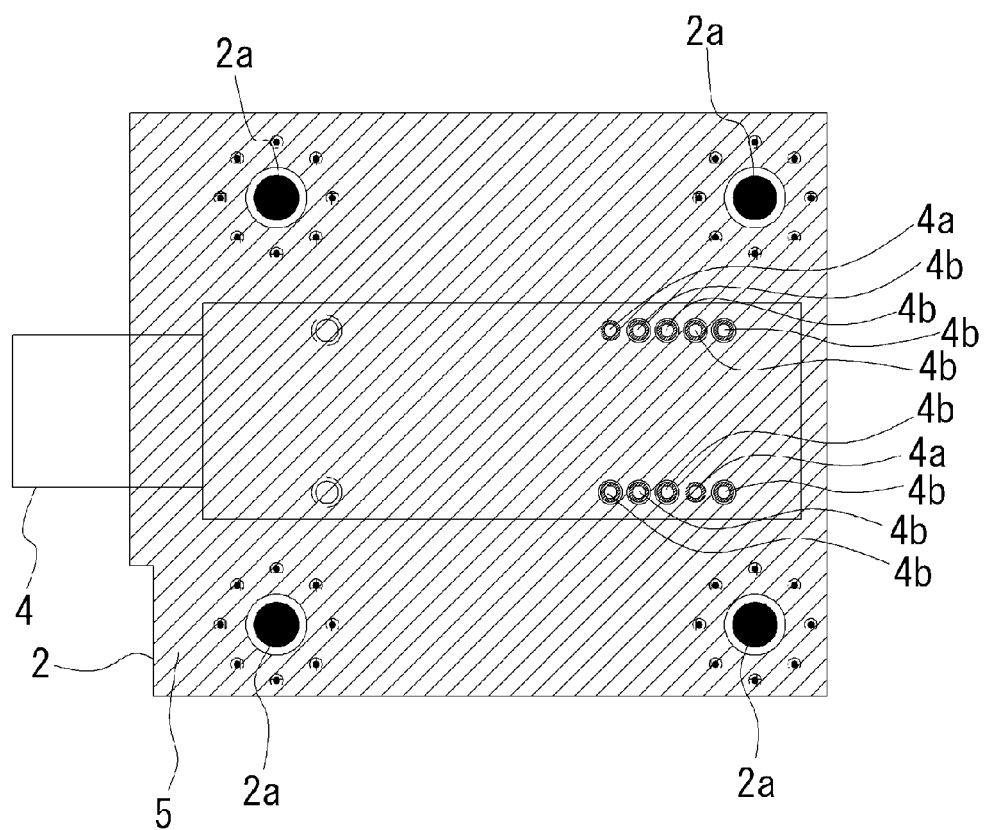
FIG. 6 is an explanatory view of a surface, on which the electronic element is mounted, of a board according to the first embodiment.

FIG. 6 is an explanatory view of a mounting surface, on which the electronic element 4 is mounted, of the printed board 2. The ground pattern 5 is provided on the printed board 2 so as to cover the entire area of the mounting surface on which the electronic element 4 is mounted. However, in order to insert ground pins 4a and signal pins 4b of the electronic element 4 into via holes provided in the printed board 2, no pattern is provided at the positions corresponding to these pins. The ground pattern 5 acts as a signal ground.

FIGS. 7A to 7C are third views of the first hardware 6. FIG. 7A is a plan view, FIG. 7B is a front view, and FIG. 7C is a back view. The first hardware 6 includes: a top plate 6a; a front plate 6b; and two side plates 6c. That is, in the first hardware 6, four plates are arranged in four directions, respectively. The side plate 6c is provided with flange portions 6c1 extending outwardly. The flange portion 6c1 is provided with a screw hole 6c2.

The first hardware 6 covers the electronic element 4 such that the flange portions 6c1 come into contact with the ground pattern 5. In this case, a conductive sheet 7 corresponding to a third member is arranged at the inner side of the first hardware 6. The conductive sheets 7 are attached on the top plate 6a and the side plates 6c so as to come into contact with the electronic element 4 when the first hardware 6 covers the electronic element 4. The conductive sheet 7 is applied by use of an adhesive tape having acrylic-based adhesive with electrical conductivity. In the present embodiment, Shield Form (product name) of ZIPPERTUBING (Japan), Ltd., is used as the conductive sheet 7.

The conductive sheet 7 is a polyester cloth as a base with copper and nickel layers, both having conductive properties, formed thereon. The conductive sheet 7 is provided with a projection portion 7a. The projection portion 7a is formed by arranging polyurethane form within the sheet. In a case where the electronic element 4 and the first hardware 6 come into close contact with each other, the conductive sheet 7 can be eliminated. However, the provision of the conductive sheet 7 ensures the fine connection between the electronic element 4 and the first hardware 6.

The first hardware 6 covers the electronic element 4, and causes the flange portions 6c1 to come into contact with the grand pattern 5. Next, screws 8 are respectively fitted into the screws holes 6c2, so that the first hardware 6 is secured. Accordingly, the first hardware 6 and the ground pattern 5 are electrically connected with each other. In the result, the electronic element 4 is entirely surrounded with the conductive members. Further, the signal grand of the printed board arranged within the electronic element 4 is connected with the ground pattern 5 through the outer surface of the electronic element 4, the conductive sheet 7, and the first hardware 6. Consequently, the ESD resistance is improved. Therefore, the stable photoelectric conversion and signal transmission are ensured in the electronic element 4. Additionally, the first hardware 6 and the ground pattern 5 may be connected with each other by solder instead of the screws 8. Further, a connecting portion having a clip shape may be provided for connection with the ground pattern 5, and the first hardware 6 may be inserted into the connecting portion. In this case, the flange portion 6c1 can be eliminated. In this way, it is only necessary for the first hardware 6 to be electrically connected to the ground pattern 5.

(Second Embodiment)

Next, a shield structure 210 will be described as according to a second embodiment with reference to FIGS. 8 to 14. In the shield structure 210 according to the second embodiment, the shield structure 110 according to the first embodiment is added with a second hardware 20 corresponding to a second member. Hereinafter, in the second exemplary embodiment, the same components and configurations as those employed in the first exemplary embodiment have the same reference numerals and a detailed explanation will be omitted, if not otherwise specified.

Figure 8:
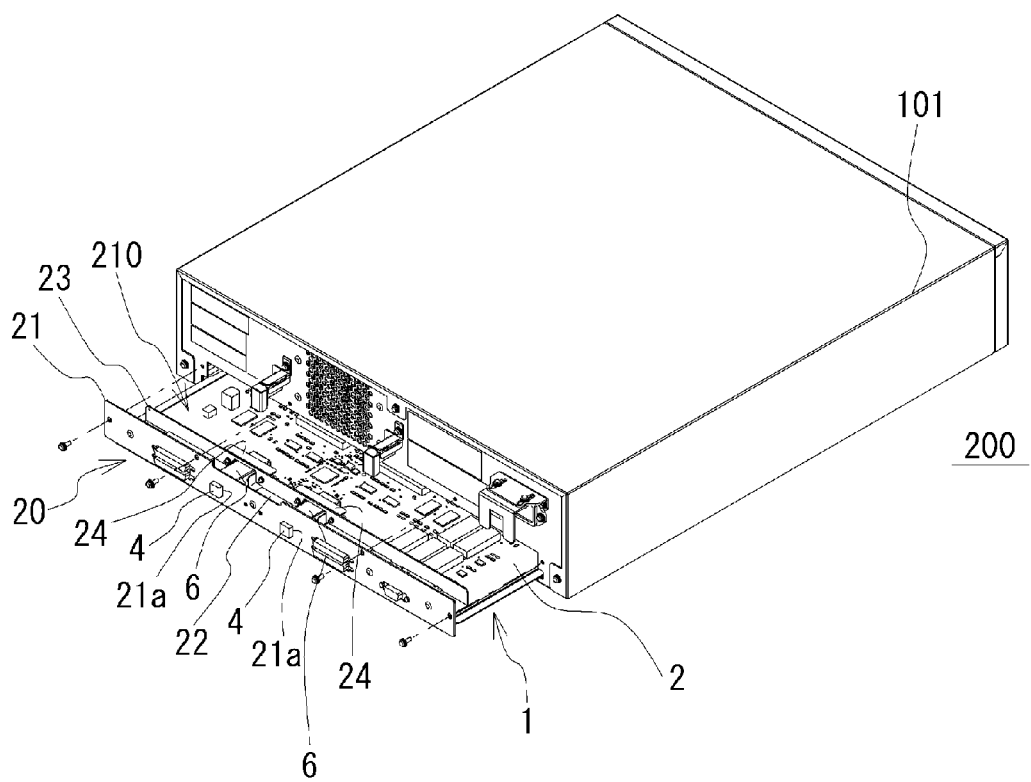
FIG. 8 is a perspective view of an electronic element with a shield structure according to a second embodiment.
Figure 9:
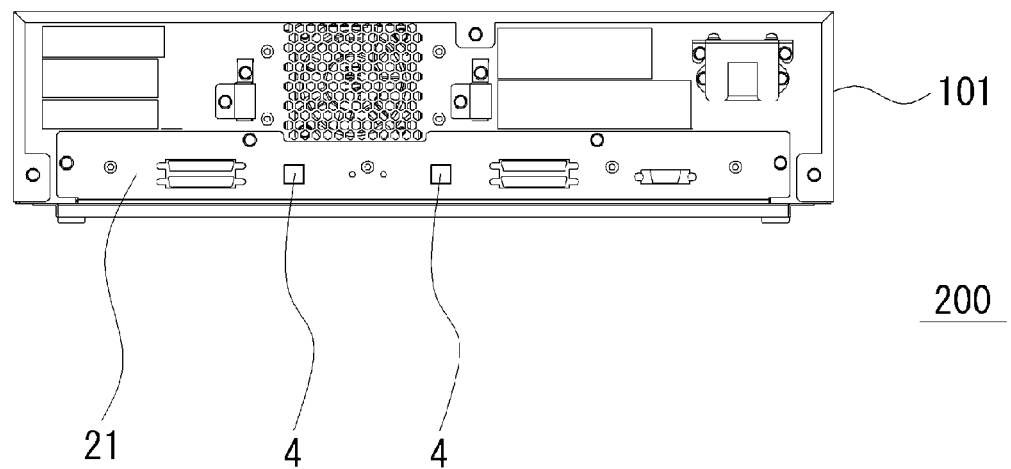
FIG. 9 is a back view of the electronic device with the shield structure according to the second embodiment.
Figure 10:
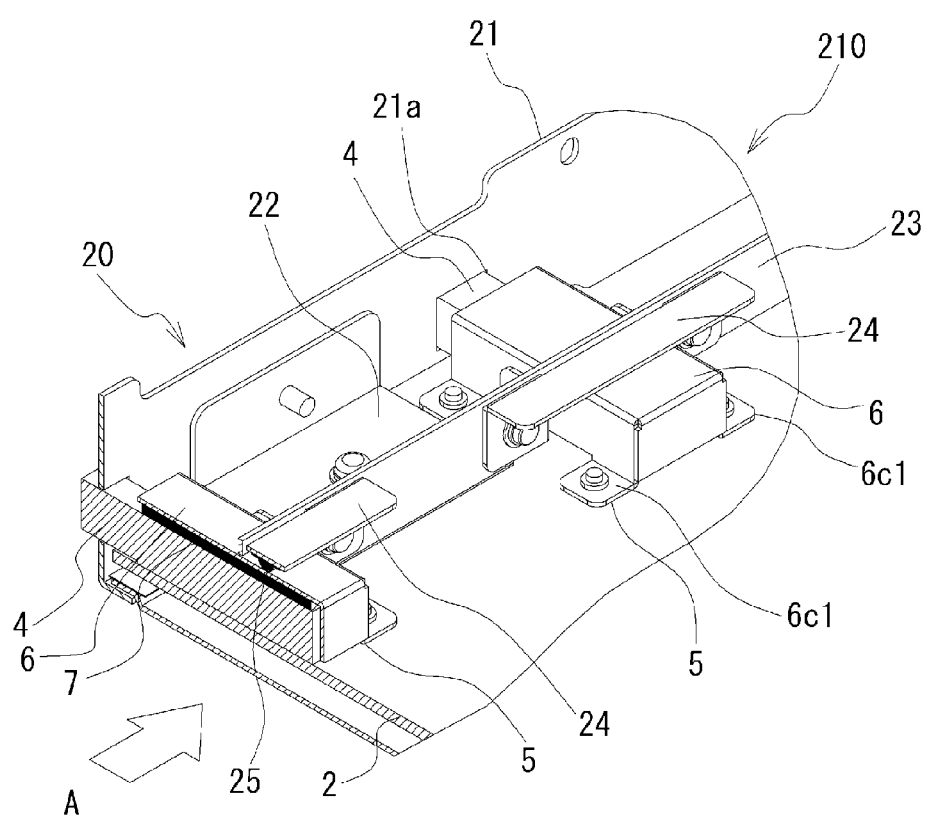
FIG. 10 is a perspective view of a board unit partially cut off above the electronic element according to the second embodiment.
Figure 11:
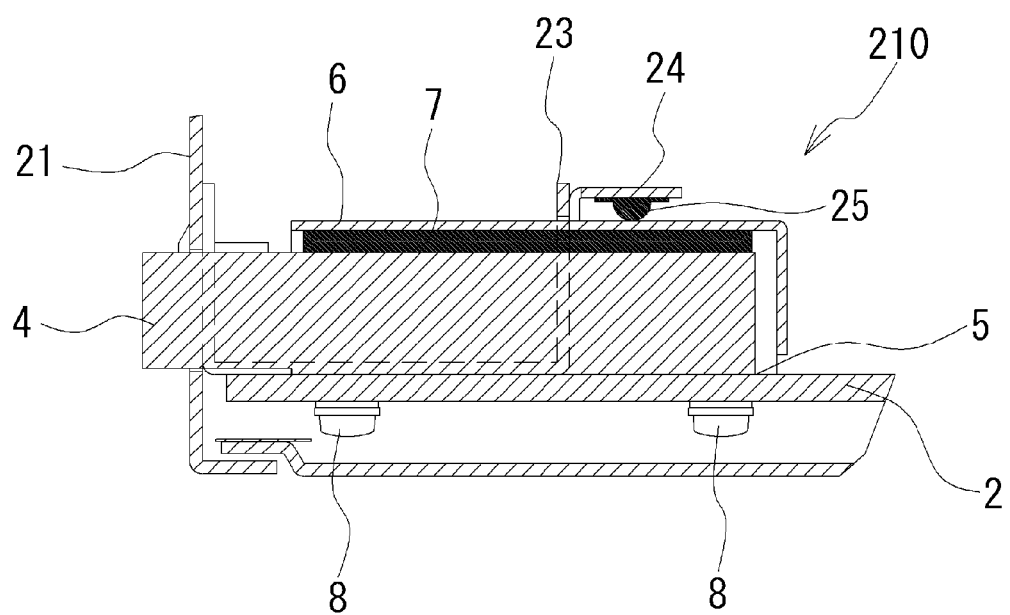
FIG. 11 is a cross sectional view of a board unit partially cut off above the electronic element according to the second embodiment.
Figure 12:
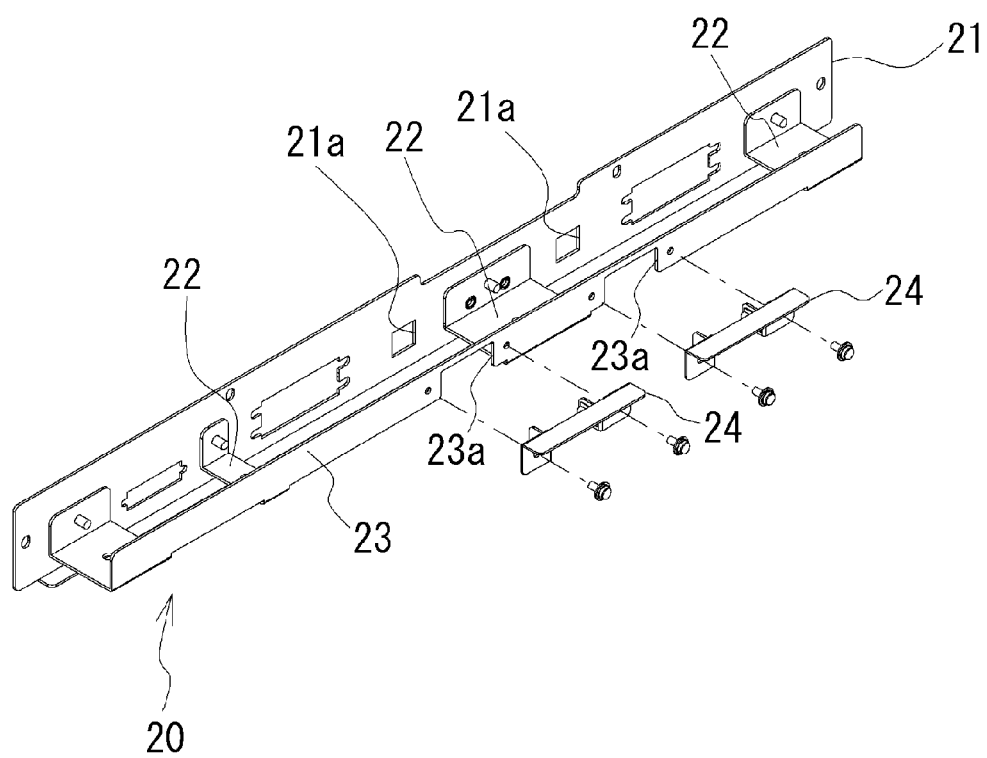
FIG. 12 is an exploded perspective view of a second hardware.
Figure 14A:
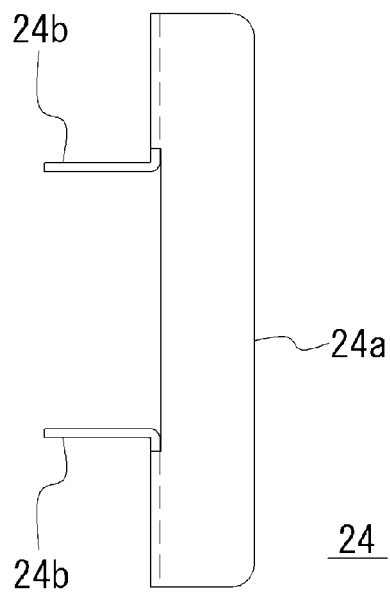
FIGS. 14A to 14C are three views of a pressing hardware included in the second hardware.
Figure 14B:
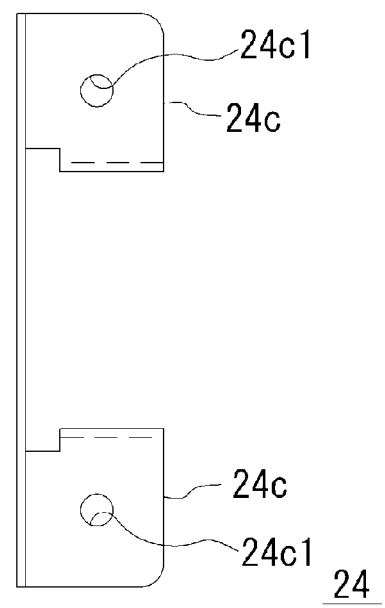
Figure 14C:
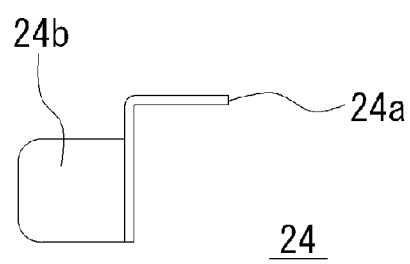

FIG. 8 is a perspective view of an electronic device 200 provided with the shield structure 210 according to the second embodiment. FIG. 9 is a back view of the electronic device 200. FIG. 10 is a perspective view of a board unit 2 partially cut off above the electronic element 4 in the second embodiment. FIG. 11 is a cross sectional view of the board unit 2 partially cut off above the electronic element 4 in the second embodiment. FIG. 11 is a view when viewed in the direction A illustrated in FIG. 10. FIG. 12 is an exploded perspective view of the second hardware 20 included in the shield structure 210. FIGS. 13A to 13C are three views of a hardware included in the second hardware 20. FIG. 13A is a back view. FIG. 13B is a side view. FIG. 13C is a bottom view. FIGS. 14A to 14C are three views of a pressing hardware 24 included in the second hardware 20. FIG. 14A is a plan view, FIG. 14B is a back view, and FIG. 14C is a side view.

The second hardware 20 includes: a back plate 21; a ground portion 22; a connecting portion 23; and a pressing hardware 24, as illustrated in FIG. 12. The back plate 21 corresponds to the back plate 3 in the first embodiment, as illustrated in FIG. 13. The back plate 21 is provided with openings 21a. The connecting portion of the electronic element 4 and the outer device (for example, the server 150 illustrated in FIG. 3) is exposed from the opening 21a. The ground portion 22 and the connecting portion 23 are formed by bending a metallic plate. The metallic plate is attached to the back plate 21. The ground portion 22 is a portion coming into contact with the ground pattern 5 provided in the board 2. Further, the connecting portion 23 is provided with a concave portion 23a having a shape corresponding to the outer shape of the first hardware 6, as illustrated in FIG. 12. The connecting portion 23 is a portion which comes into contact with the first hardware 6. The pressing hardware 24 includes: a pressing portion 24a parallel with the top plate 6a of the first hardware 6; and two guide portions 24b parallel with the side plate 6c, as illustrated in FIGS. 14A to 14C. The pressing hardware 24 is attached to the connecting portion 23 with the guide portion 24b inserted into the concave portion 23a provided in the connecting portion 23, as illustrated in FIG. 12.

As illustrated in FIGS. 10 and 11, the second hardware 20 is secured on the board 2 with screws such that the ground portion 22 comes into contact with the ground pattern 5 provided on the board 2. In this case, a conductive sheet 25, similar to the conductive sheet 7, is arranged between the pressing portion 24a of the pressing hardware 24 and the first hardware 6, between the guide portion 24b and the first hardware 6. Accordingly, the contact property between the second hardware 20 and the first hardware 6 is improved, and the electrical connection therebetween is improved. Further, the method of securing the second hardware 20 is not limited to screws.

In the shield structure 210 according to the second embodiment, when the board unit 1 is arranged within the electronic device 200 as illustrated in FIG. 8, the back plate 21 comes into contact with the chassis 101 as illustrated in FIG. 9. Accordingly, the first hardware 6 corresponding to signal ground has an electric potential identical to that of frame ground through the second hardware 20. In the result, the influence of noise is reduced, and the ESD tolerance is further improved. Therefore, the stable photoelectric conversion and signal transmission are ensured in the electronic element 4. Additionally, the back plate 21 has an effect of suppressing the EMI (Electro Magnetic Interference).

(Third Embodiment)

Next, a shield structure 310 will be described as according to a third embodiment with reference to FIGS. 15 to 22. In the shield structure 310 according to the third embodiment, in the shield structure 210 according to the second embodiment, a third hardware 30 corresponding to a forth member is added. Hereinafter, in the second exemplary embodiment, the same components and configurations as those employed in the first exemplary embodiment have the same reference numerals and a detailed explanation will be omitted, if not otherwise specified.

Figure 15:
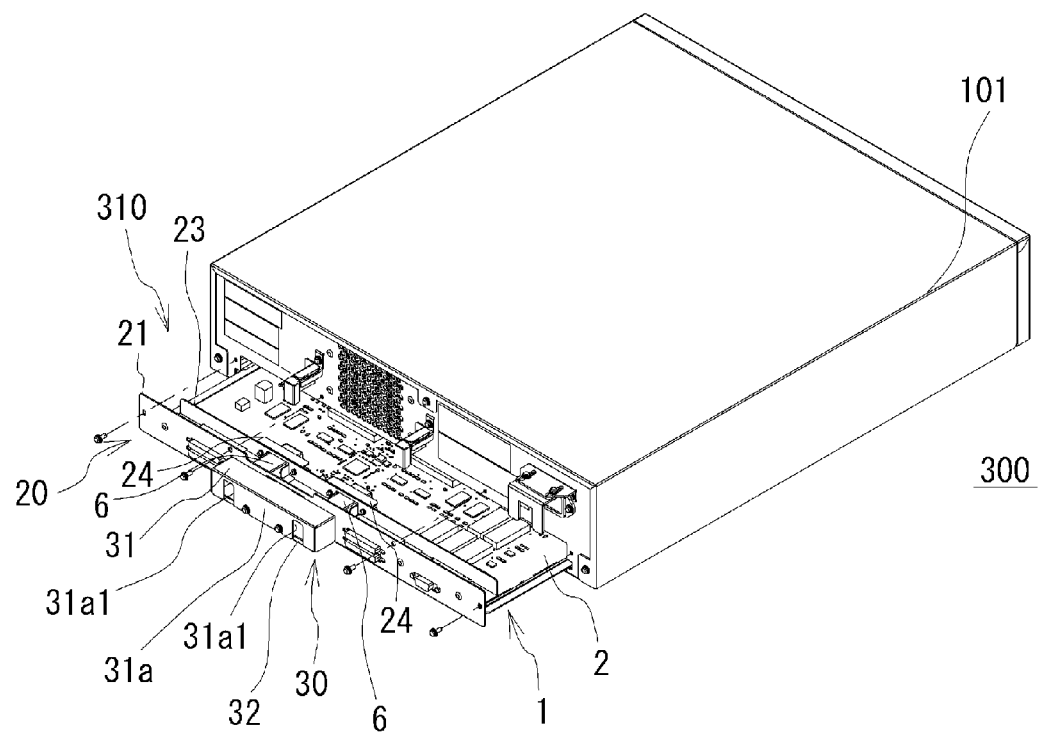
FIG. 15 is a perspective view of an electronic device with a shield structure according to the third embodiment.
Figure 16A:
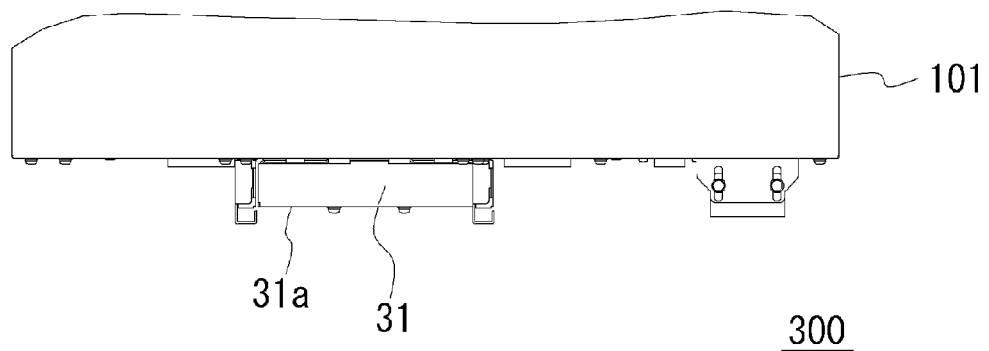
FIG. 16A is a plan view of a rear end of the electronic device with the shield structure according to the third embodiment.
Figure 16B:
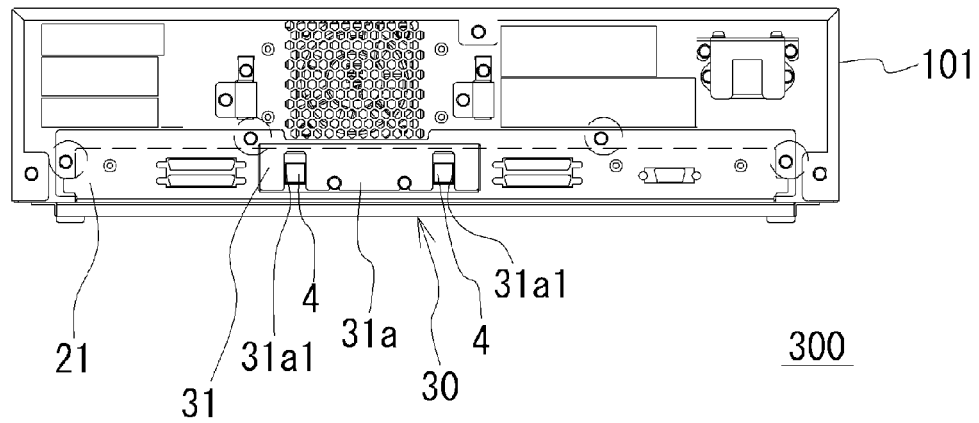
FIG. 16B is a back view of the electronic device.
Figure 17:
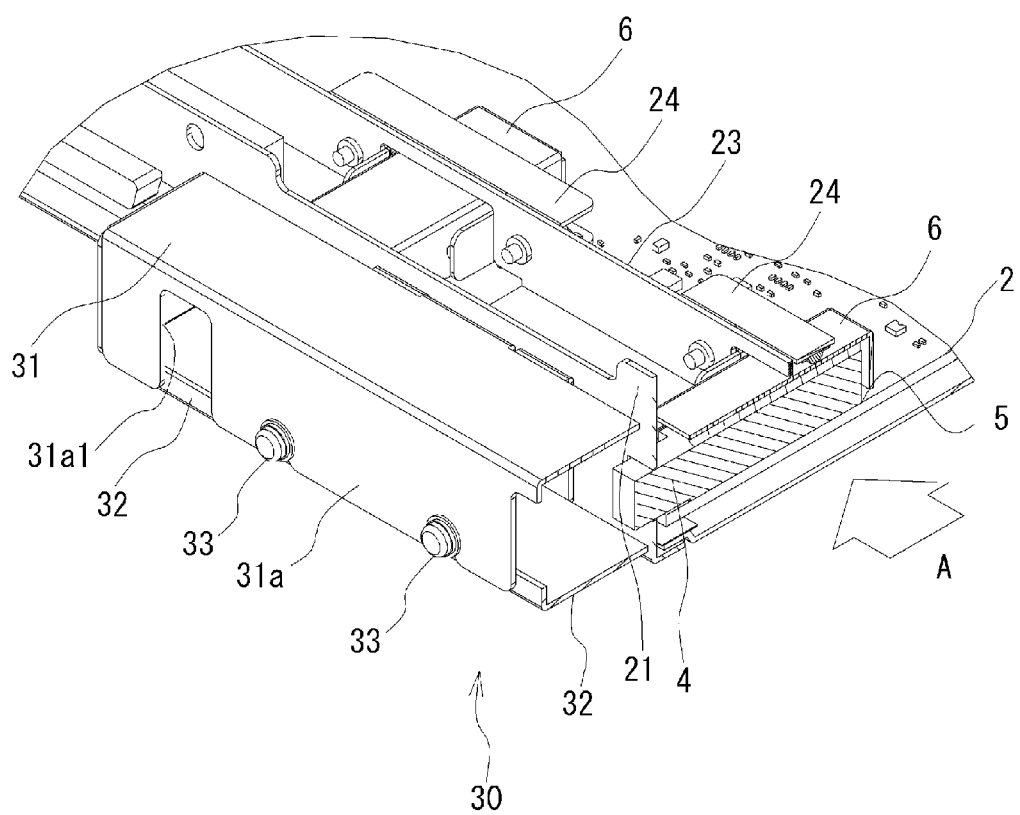
FIG. 17 is a perspective view of the board unit partially cut off above the electronic element according to the third embodiment.
Figure 18:
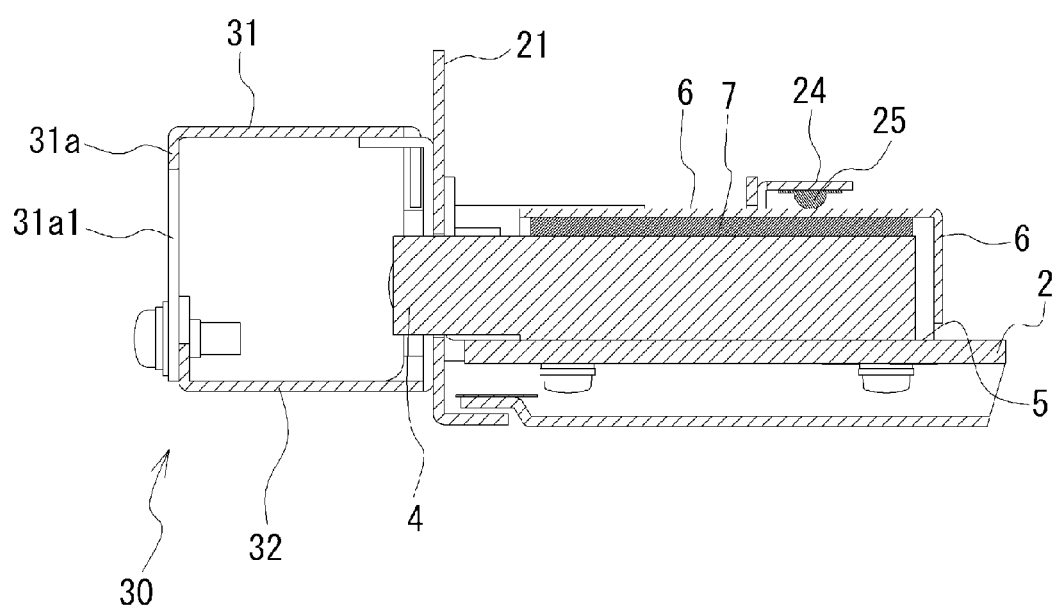
FIG. 18 is a cross sectional view of the board unit partially cut off above the electronic element according to the third embodiment.
Figure 19:
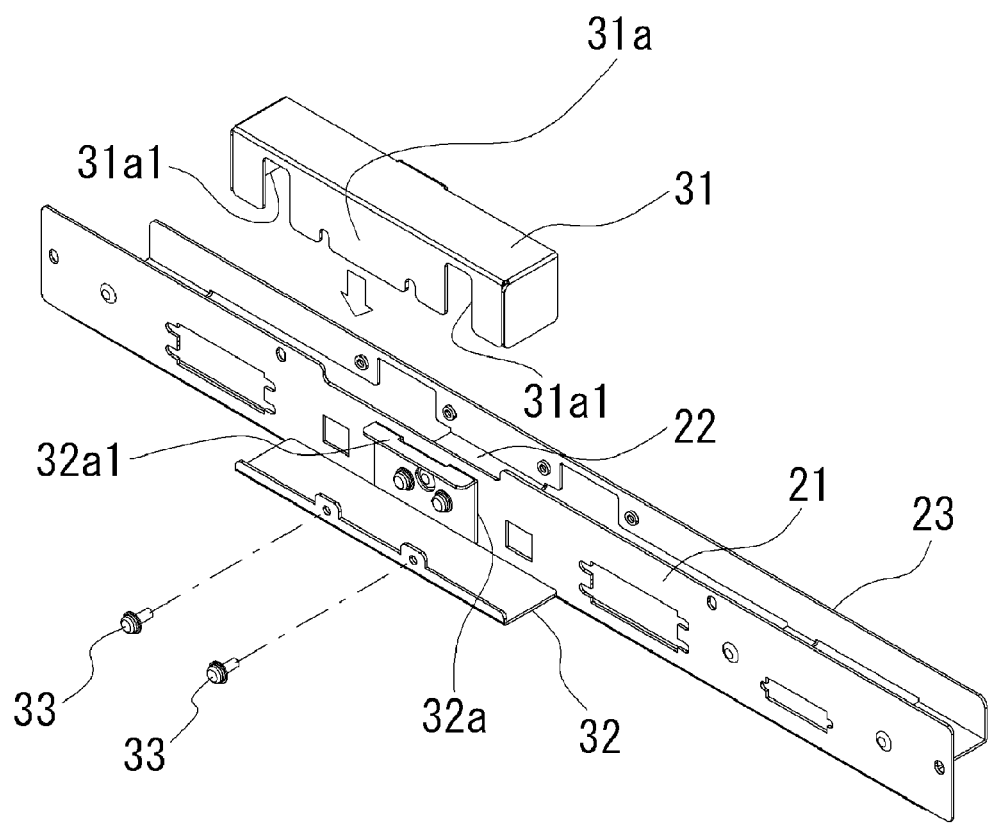
FIG. 19 is an exploded perspective view of the second hardware and a third hardware.

FIG. 15 is a perspective view of an electronic device 300 with the shield structure 310 according to the third embodiment. FIG. 16A is a plan view of a rear end of the electronic device 300 with the shield structure 310 according to the third embodiment. FIG. 16B is a back view of the electronic device 300. FIG. 17 is a perspective view of the board unit 2 partially cut off above the electronic element 4 according to the third embodiment. FIG. 18 is a cross sectional view of the board unit 2 partially cut off above the electronic element 4 according to the third embodiment. FIG. 18 is a view when viewed in the direction A illustrated in FIG. 17. FIG. 19 is an exploded perspective view of the second hardware 20 and the third hardware 30.

Figure 20A:
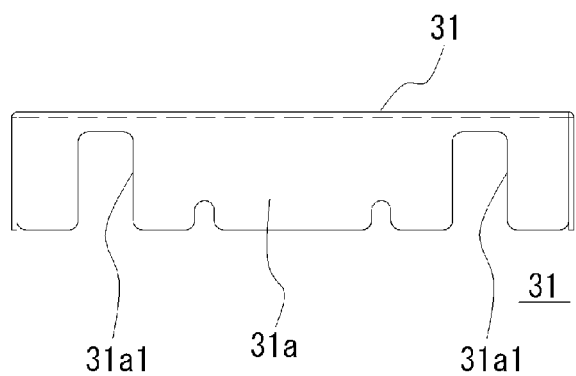
FIGS. 20A to 20C are three views of a covering hardware included in the third hardware.
Figure 20B:
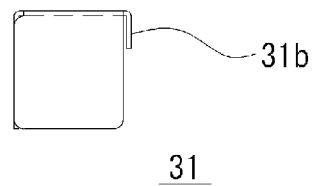
Figure 20C:
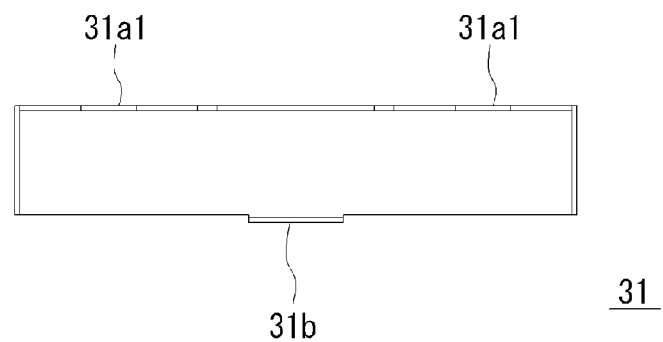
Figures 21A, 21B:
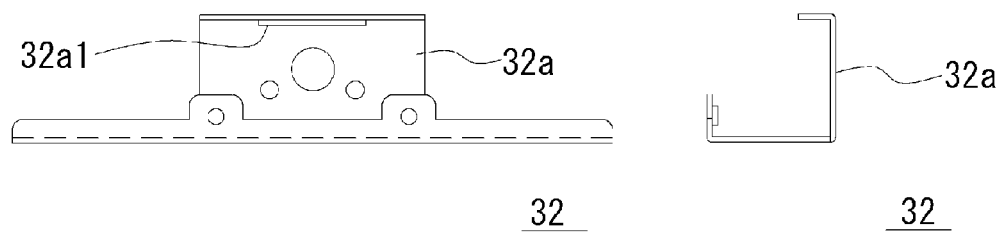
FIGS. 21A to 21C are three views of a receiving hardware included in the third hardware.
Figure 21C:
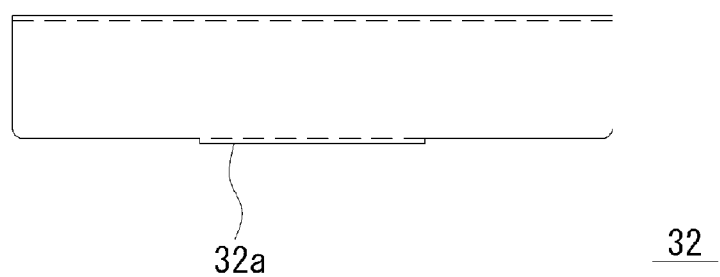
Figure 22:
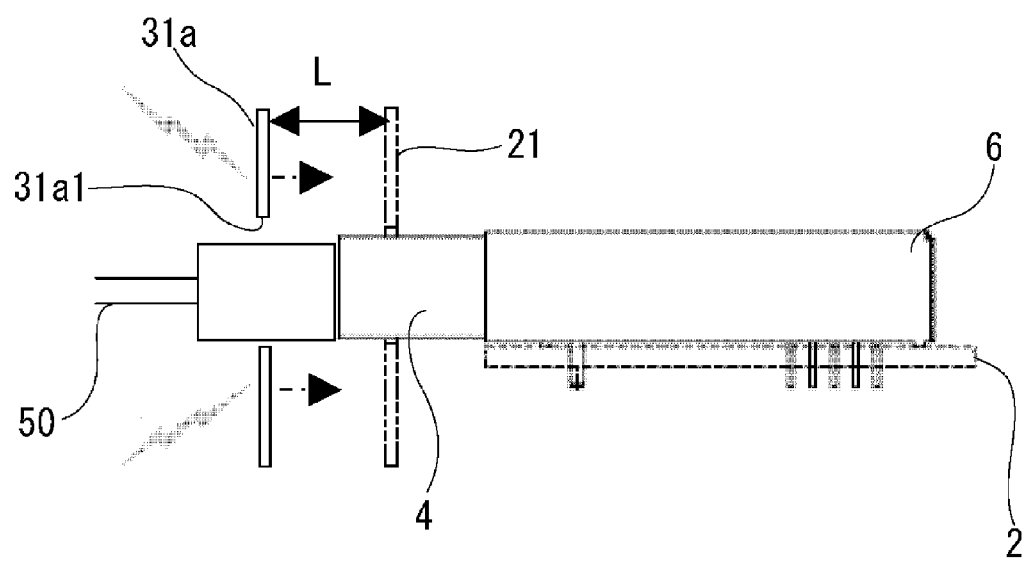
FIG. 22 is an explanatory view of a distance between a back plate and a distant portion of the covering hardware.

FIGS. 20A to 20C are three views of a covering hardware 31 included in the third hardware 30. FIG. 20A is a back view. FIG. 20B is a side view. FIG. 20C is a bottom view. FIGS. 21A to 21C are three views of a receiving hardware 32 included in the third hardware 30. FIG. 21A is a back view. FIG. 21B is a side view. FIG. 21C is a bottom view. FIG. 22 is an explanatory view of a distance between the back plate 21 and a distant portion of the covering hardware 31.

The third hardware 30 includes the covering hardware 31 and the receiving hardware 32, as illustrated in FIGS. 17 to 19. The receiving hardware 32 is attached to the back plate 21. The covering hardware 31 is attached to the receiving hardware 32.

The covering hardware 31 includes a distant portion 31a which is arranged apart from the openings 21a provided in the back plate 21 included in the second hardware 20. The reason why the distant portion 31a is provided in this way is to deal with the low ESD tolerance occurring at a case where the covering hardware 31 comes into contact with the periphery of the opening 21a of the back plate 21. Specifically, after the electronic element 4 is connected with an optical fiver, if a charged operator touch the periphery of the opening 21a of the back plate 21, the electricity might be discharged. Therefore, the noise caused by the electric discharge might enter the electronic device 100. The noise might malfunction the electronic device 100. As illustrated in FIG. 22, the distant portion 31a and the back plate 21 included in the second hardware 20 are spaced by the distance L. In the illustrated covering hardware 31, L is 20 mm. The provision of the distant portion 31a permits the noise generated at an outside of the electronic device 300 to be spaced from the electronic element 4. This can improve the ESD tolerance. L may be set to more than or equal to 20 mm.

The distant portion 31a is provided with openings 31a1. The optical fiver cable is connected to the electronic element 4 through the opening 31a1. However, the distance between the opening 31a1 and the electronic element 4 is long as illustrated in FIG. 18. In other words, the electronic element 4 is arranged in the back of the covering hardware 31. For this reason, it is difficult for the optical fiver cable to be connected to and disconnected from the electronic element 4. Accordingly, the covering hardware 31 is attachable to and detachable from the receiving hardware 32. The receiving hardware 32 is provided with an attachment portion 32a attachable with the back plate 21. The attachment portion 32a is secured in the receiving hardware 32. The receiving hardware 32 is provided with a slot 32a1 at its upper portion. A lug portion 31b of the covering hardware 31 is inserted into the slot 32a1. The lug portion 31b is inserted into the slot 32a1, and the covering hardware 31 is secured in the receiving hardware 32 with the screws 33.

Such a shield structure 310 according to the third embodiment is arranged within the electronic device 200 as illustrated in FIG. 15, so the back plate 21 comes into contact with the chassis 101 as illustrated in FIG. 16B. Therefore, the first hardware 6 corresponding to the signal ground has an identical potential to that of the frame ground through the second hardware 20. This reduces the influence of the noise and improves the ESD tolerance. Also, the provision of the distant portion 31a further improves the ESD tolerance, in specific, in the periphery of the opening 31a1. Therefore, the stable photoelectric conversion and signal transmission are ensured in the electronic element 4.

(Fourth Embodiment)

Next, a shield structure 410 will be described as according to a fourth embodiment with reference to FIGS. 23 to 28. The shield structure 410 according to the fourth embodiment includes a fourth hardware 40 instead of the third hardware 30 of the shield structure 310 according to the third embodiment. The fourth hardware 40 corresponds to the fourth member. Hereinafter, in the second exemplary embodiment, the same components and configurations as those employed in the first exemplary embodiment have the same reference numerals and a detailed explanation will be omitted, if not otherwise specified.

Figure 23:
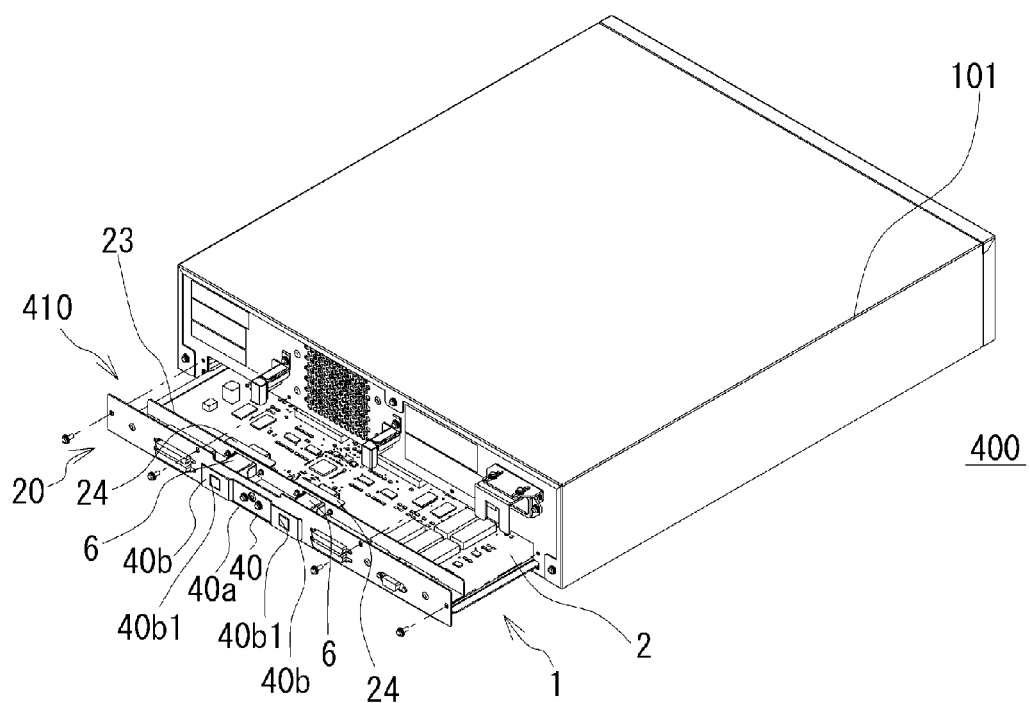
FIG. 23 is a perspective view of an electronic device with a shield structure according to the third embodiment.
Figure 24A:
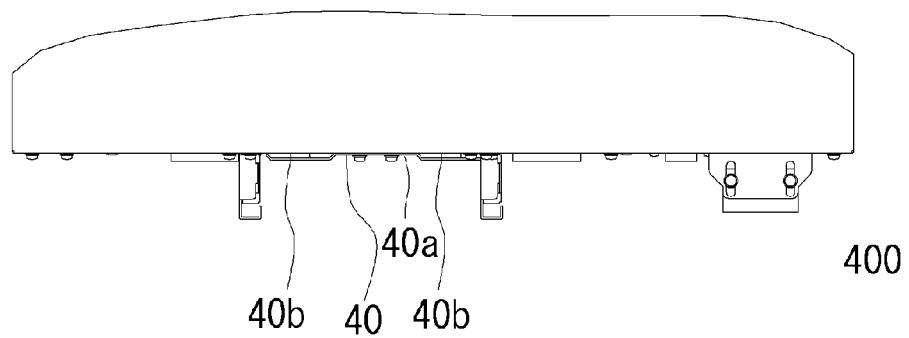
FIG. 24A is a plan view of a rear end of the electronic device with the shield structure according to the fourth embodiment.
Figure 24B:
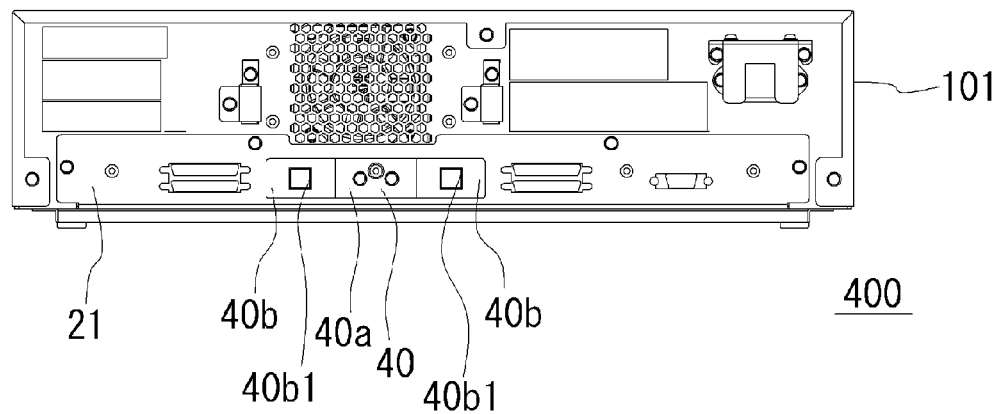
FIG. 24B is a back view of the electronic device.
Figure 25:
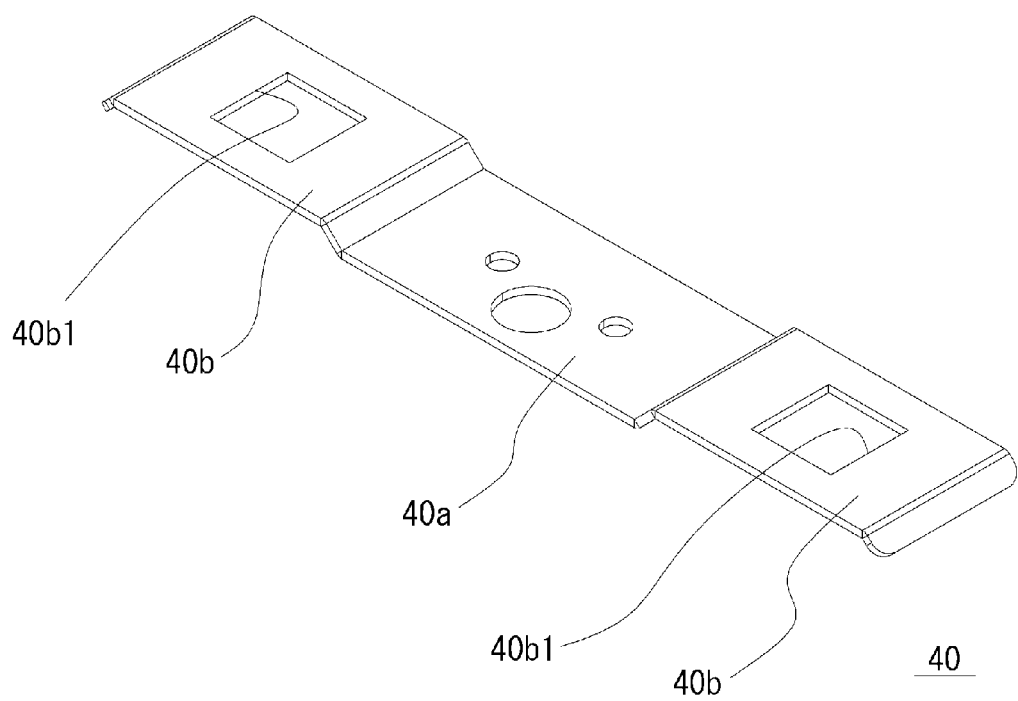
FIG. 25 is a perspective view of the fourth hardware.
Figure 27:
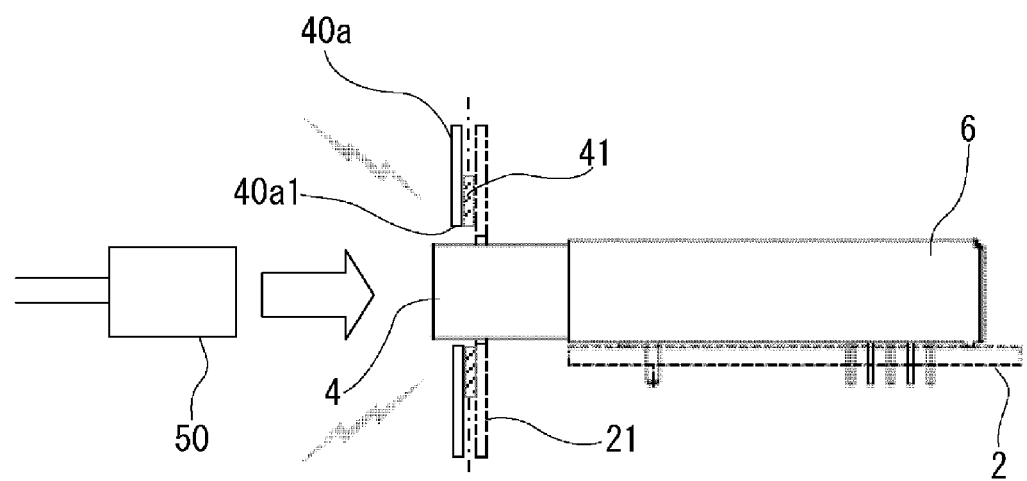
FIG. 27 is a schematic view of a part of the shield structure according to the fourth embodiment when viewed from the side thereof.
Figure 28:
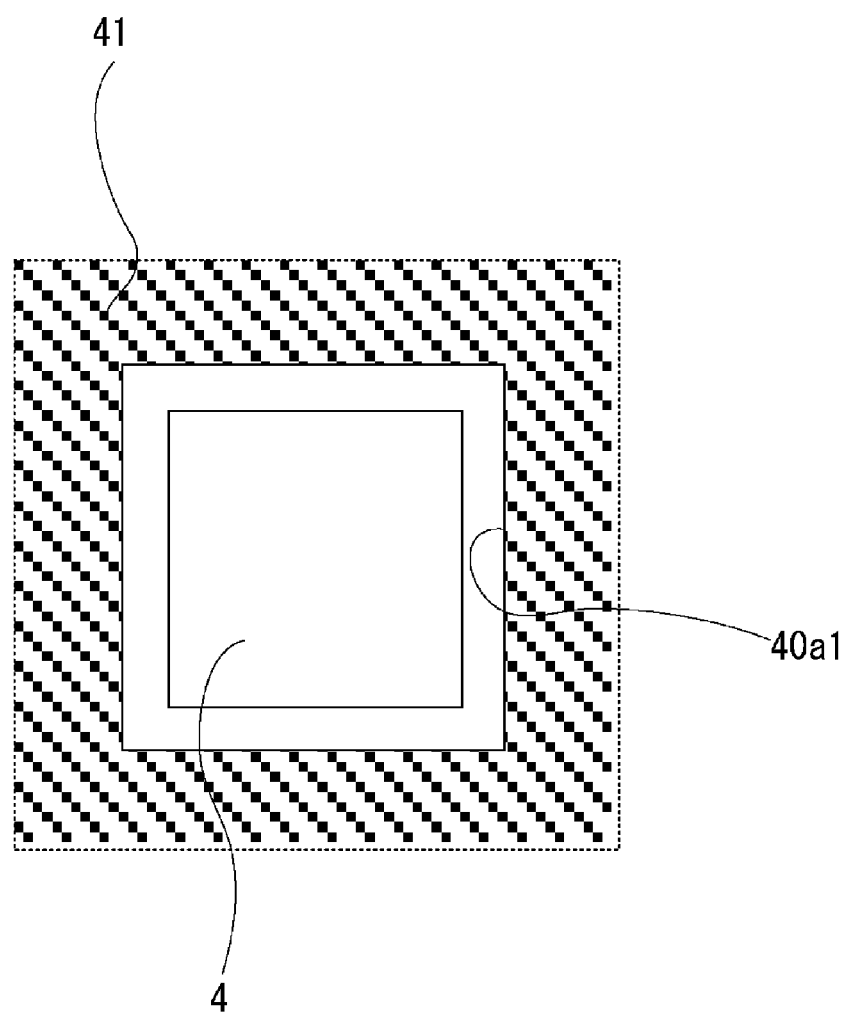
FIG. 28 is a schematic view of the arrangement of a conductive sheet in the shield structure according to the fourth embodiment.

FIG. 23 is a perspective view of an electronic device 400 with the shield structure 410 according to the third embodiment. FIG. 24A is a plan view of a rear end of the electronic device 400 with the shield structure 410 according to the fourth embodiment. FIG. 24B is a back view of the electronic device 400. FIG. 25 is a perspective view of the fourth hardware 40. FIGS. 26A to 26C are three views of the fourth hardware 40. FIG. 26A is a back view. FIG. 26B is a side view. FIG. 26C is a bottom view. FIG. 27 is a schematic view of a part of the shield structure 410 according to the fourth embodiment when viewed from the side thereof. FIG. 28 is a schematic view of the arrangement of a conductive sheet 41 in the shield structure 410 according to the fourth embodiment.

As illustrated in FIGS. 25 to 26C, the fourth hardware 40 includes: a contact portion 40a provided at the center; and distant portions 40b provided to extend from the contact portion 40a. The distant portion 40b is provided with an opening 40b1.

The fourth hardware 40 is attached to the conductive sheet 41 such that the contact portion 40a comes into contact with the back plate 21. A conductive sheet 41 similar to the conductive sheet 7 is arranged between the distant portion 40b and the back plate 21 as illustrated in FIGS. 27 and 28. The conductive sheet 41 is arranged, so the distance between the distant portion 40b and the back plate 21 is set to 2 mm and is smaller than the distance L between the distant portion 31a and the back plate 21 according to the second embodiment. The conductive sheet 41 is arranged around the opening 40b1 as illustrated in FIG. 28.

In this way, the provision of the conductive sheet 41 prevents the noise from entering the device and improves the ESD tolerance. That is, the conductive sheet 41 is arranged around the opening 40b1, thereby lowering the impedance between the back plate 21 and the distant portion 40b. Accordingly, the voltage of the generated noise is lowered, thereby reducing the influence on the electronic element 4 within the electronic device 400, other electric circuits, and other electronic elements. The conductive sheet 41 ensures the broad contact area, thereby making the resistance low.

The shield structure 410, according to the fourth embodiment, including the distant portion 31a and the conductive sheet 41 can improve the ESD tolerance, in specifically, at the periphery of the opening 40b1. Consequently, the stable photoelectric conversion and signal transmission are ensured in the electronic element 4.

(Verification)

Figure 29A:
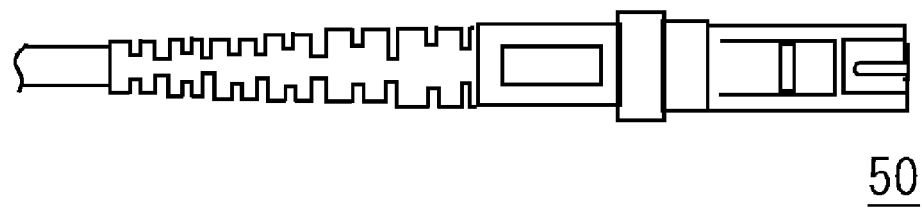
FIGS. 29A to 29C are explanatory views of an optical fiver cable attached to the electronic device.
Figure 29B:
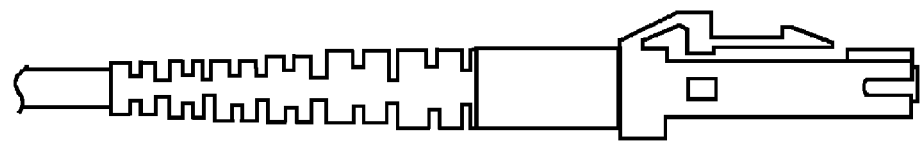
Figure 29C:
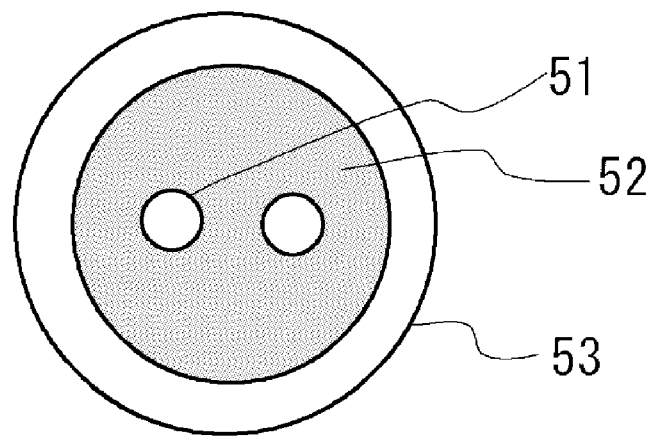

Next, a description will be given of a verification test of the shield structure mentioned above. Here, the description will be given of the shield structures according to the second, third, and fourth embodiments in which the frame ground connection is ensured. When the verification test is performed, an optical fiver cable 50 was attached to the electronic element 4 in order to realize its actual use state. In the test, the optical fiver cable 50 made by Furukawa Electric Co., Ltd. is used. FIGS. 29A to 29C are explanatory views of the optical fiver cable 50 attached to the electronic device. FIG. 29A is a plan view of a connector portion. FIG. 29B is a side view of the connector portion. FIG. 29C is a cross sectional view of a cable. The optical fiver cable 50 includes: optical fibers 51 made of a silicon resin and a polyamide resin; a buffer layer 52 arranged around the optical fibers 51 and made of aramid fibers; and a covering 53 as the most outer covering made of a polyvinyl chloride.

Figure 30:
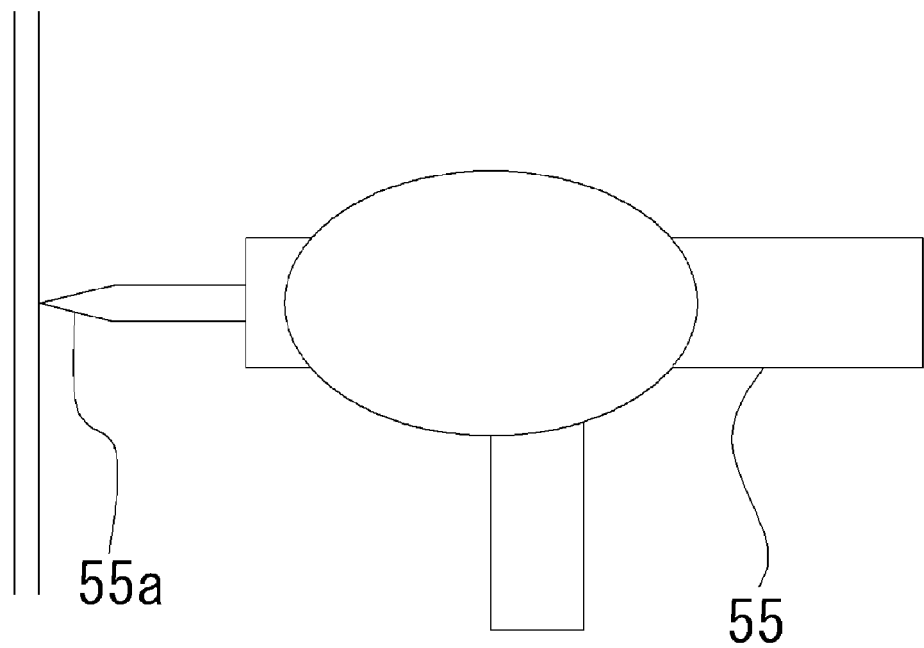
FIG. 30 is an explanatory view of an ESD test machine.

FIG. 30 is an explanatory view of an ESD test machine 55. The ESD test machine 55 is provided with a discharge electrode 55a. The verification test was the direct discharge test in which the electricity was discharged by bringing the discharge electrode 55a into contact with a measured portion. The number of the application was 25 times in one second.

(In the Case where No Measures are Taken)

In this case, a shield structure such as the first hardware 6 or the second hardware 20 was not provided and that any measures for improving the ESD tolerance was not taken.

The measured ESD tolerance was about plus or minus 2 kV at each position of the chassis of the electronic device.

(Effects of the Second Embodiment)

In this case, the shield structure 210 of the first hardware 6 and the second hardware 20 is provided. In this case, the measured ESD tolerance was about plus or minus 10 kV at the positions other than the periphery of the opening 21a of the back plate 21. The improvement of the ESD tolerance was verified.

However, the measured ESD tolerance was about plus or minus 2 kV in the periphery of the opening 21a of the back plate 21.

(Effects of the Third Embodiment)

In this case, the shield structure 310, where the third hardware 30 is provided in addition to the second embodiment, is provided. In this case, the measured ESD tolerance was about plus or minus 10 kV in the periphery of the opening 31a1 of the distant portion 31a. The improvement of the ESD tolerance was verified in the periphery of the opening.

(Effects of the Fourth Embodiment)

In this case, the shield structure 410, where the fourth hardware 40 and the conductive sheet 41 is provided in addition to the second embodiment, is provided. In this case, the measured ESD tolerance was about plus or minus 8 kV in the periphery of the opening 40b1 of the distant portion 40b. The improvement of the ESD tolerance was verified in the periphery of the opening. Additionally, when the conductive sheet 41 is removed, the measured ESD tolerance was about plus or minus 6 kV in the periphery of the opening 40b1. It is considered that the conductive sheet 41 also contributes to the improvement of the ESD tolerance. Further, it is considered that the ESD tolerance is higher, as the distance between the back plate 21 and the distant portion is longer in light of the comparison with the third embodiment.

The shield structures described herein improve the ESD tolerance by providing the signal ground and the frame ground for the interface of the electronig device.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A shield structure for an electronic element, comprising:
    a ground pattern provided in a board;
    a first member having electrical conductivity, covering the electronic element, and connected with the ground pattern; and
    a second member having electrical conductivity, coming into contact with a chassis of an electronic device housing the board on which the electronic element is implemented, and including a first portion and a second portion,
    wherein the first portion contacts with the ground pattern and the second portion is located above the first member and contacts with the first member so as to press the first member toward the board side.

2. The shield structure for an electronic element of claim 1, further comprising a third member having electrical conductivity, arranged at an inside of the first member, and coming into contact with the electronic element.

3. The shield structure for an electronic element of claim 1, further comprising a fourth member including a distant portion spaced apart from an opening, of the second member, for connecting the electronic element with an external device.

4. The shield structure for an electronic element of claim 3, further comprising a fifth member having electrical conductivity, and arranged between the second and fourth members.

5. The shield structure for an electronic element of claim 1, wherein the electronic element is a photoelectric conversion element.

6. An electronic device comprising:
    a shield structure for an electronic element, comprising:
    a ground pattern provided in a board;
    a first member having electrical conductivity, covering the electronic element, and connected with the ground pattern; and
    a second member having electrical conductivity, coming into contact with a chassis of an electronic device housing the board on which the electronc element is implemented, and including a first portion and a second portion,
    wherein the first portion contacts with the ground pattern and the second portion is located above the first member and contacts with the first member so as to press the first member toward the board side.

7. A shield structure for an electronic element, comprising:
    a ground pattern provided in a board;
    a first member having electrical conductivity, covering the electronic element, and connected with the ground pattern;
    a second member having electrical conductivity, coming into contact with a chassis of an electronic device housing the board on which the electronic element is implemented, and coming into contact with the ground pattern and the first member; and
    a third member having electrical conductivity, arranged at an inside of the first member, and coming into contact with the electronic element.

* * * * *

UNITED STATES PATENT AND TRADEMARK OFFICE
CERTIFICATE OF CORRECTION

| | | |
|---|---|---|
| PATENT NO. | : 8,797,763 B2 | |
| APPLICATION NO. | : 13/005718 | |
| DATED | : August 5, 2014 | |
| INVENTOR(S) | : Naomi Fukunaga et al. | |

It is certified that error appears in the above-identified patent and that said Letters Patent is hereby corrected as shown below:

In the Claims

Column 10, Line 18 (Approx.), In Claim 6, delete "electronc element" and insert -- electronic element --, therefor.

Signed and Sealed this
Thirteenth Day of January, 2015

Michelle K. Lee
*Deputy Director of the United States Patent and Trademark Office*